United States Patent
Drevon et al.

(10) Patent No.: US 8,850,698 B2
(45) Date of Patent: Oct. 7, 2014

(54) METHOD FOR THE SEALED ASSEMBLY OF AN ELECTRONIC HOUSING

(75) Inventors: Claude Drevon, Toulouse (FR); Olivier Vendier, Lacroix-Falgarde (FR); Walim Ben Naceur, Bordeaux (FR)

(73) Assignee: Thales, Neuilly sur Seine (FR)

( * ) Notice: Subject to any disclaimer, the term of this patent is extended or adjusted under 35 U.S.C. 154(b) by 220 days.

(21) Appl. No.: 13/513,194

(22) PCT Filed: Nov. 10, 2010

(86) PCT No.: PCT/EP2010/067228
§ 371 (c)(1),
(2), (4) Date: Jun. 20, 2012

(87) PCT Pub. No.: WO2011/067085
PCT Pub. Date: Jun. 9, 2011

(65) Prior Publication Data
US 2012/0266462 A1  Oct. 25, 2012

(30) Foreign Application Priority Data
Dec. 4, 2009 (FR) ..................... 09 05873

(51) Int. Cl.
*H05K 3/34* (2006.01)
*H01L 21/50* (2006.01)
*H01L 23/10* (2006.01)

(52) U.S. Cl.
CPC ....... *H01L 21/50* (2013.01); *H01L 2224/32225* (2013.01); *H01L 2924/01322* (2013.01); *H01L 2224/73265* (2013.01); *H01L 23/10* (2013.01); *H01L 2924/01327* (2013.01); *H01L 2924/16195* (2013.01); *H01L 2924/16251* (2013.01); *H01L 2924/15192* (2013.01); *H01L 2224/48227* (2013.01)

USPC .................. 29/840; 29/841; 29/842; 257/680

(58) Field of Classification Search
CPC .......... H01L 2924/00013; H01L 2924/01079; H01L 2924/014; H01L 2924/0105; H01L 2924/01005; H01L 2924/01012–2924/01042; H01L 24/11–24/16; H01L 21/50; H01L 23/04; H01L 23/10; H01L 23/053; H05K 3/284; H05K 3/3436
USPC ............ 29/832, 840–842; 174/481, 260, 565; 228/180.22, 185; 257/772, 779, 257/E21.511, E23.021, 680
See application file for complete search history.

(56) References Cited

U.S. PATENT DOCUMENTS 4,673,772 A * 6/1987 Satoh et al. .................... 174/481
5,188,985 A * 2/1993 Medeiros et al. ............... 29/832
(Continued)

FOREIGN PATENT DOCUMENTS

EP       2124254 A1   11/2009
WO   2009/116136 A1    9/2009

*Primary Examiner* — Minh Trinh
(74) *Attorney, Agent, or Firm* — Baker Hostetler LLP

(57) ABSTRACT

A method is provided for the sealed assembly of an electronic housing containing one or more electronic components. The method includes: assembling the housing by bringing a support, to which the electronic components are fixed, in contact with a cover by means of a mixture-including a paste and nanoparticles in suspension in the paste. The size of the nanoparticles range from 10 to 30 nm. The housing is closed in a sealed manner by heating the housing to a temperature T of between 150° C. and 180° C. making it possible to sinter the metal nanoparticles, while subjecting the housing to a pressure greater than $2.5 \times 10^5$ Pa.

9 Claims, 3 Drawing Sheets

(56) References Cited

U.S. PATENT DOCUMENTS

| | | | |
|---|---|---|---|
| 5,808,878 A * | 9/1998 | Saito et al. | 361/818 |
| 5,844,452 A * | 12/1998 | Yamamoto et al. | 333/189 |
| 6,489,558 B1 * | 12/2002 | Baba et al. | 174/523 |
| 6,976,295 B2 * | 12/2005 | Kikushima et al. | 29/25.35 |
| 2005/0023661 A1 * | 2/2005 | Matsubara et al. | 257/678 |
| 2005/0274227 A1 | 12/2005 | Aggarwal et al. | |
| 2008/0231145 A1 | 9/2008 | Nagano et al. | |
| 2012/0266462 A1 * | 10/2012 | Drevon et al. | 29/841 |

* cited by examiner

METHOD FOR THE SEALED ASSEMBLY OF AN ELECTRONIC HOUSING

CROSS-REFERENCE TO RELATED APPLICATIONS

This application is a National Stage of International patent application PCT/EP2010/067228, filed on Nov. 10, 2010, which claims priority to foreign French patent application No. FR 09 05873, filed on Dec. 4, 2009, the disclosures of each of which are incorporated by reference in their entireties.

FIELD OF THE DISCLOSED SUBJECT MATTER

The field of the invention is that of sealed electronic housings which internally contain at least one electronic component inside a cavity. The role of the housing is essential because it directly influences the performance and the reliability of the electrical functions performed by the electronic components which it incorporates, as well as the fabrication costs and efficiencies. The primary function of a housing consists in protecting the electronic function which it contains from the external environment. The reliability of the electronic components is sensitive to the gases present in the cavity, as well as to the relative humidity of said cavity. It is essential to ensure sealed closure of the housings so as to preserve the atmosphere in terms of gas composition as well as in terms of relative humidity, which are necessary for correct operation of the encapsulated components (for example ingress of hydrogen, which degrades chips made of gallium arsenide, GaAs, inside the housing is avoided when it is sealed).

BACKGROUND

Sealed housings are known which are obtained by sealed assembly of a support and a cover by means of wheel soldering. In this case, the wheel closure requires that the size of the housing be sufficiently large (length and width of more than about 10 mm) to avoid mechanical or electrical interference between the wheels during the closure.

Housings closed in a sealed manner by means of a solder of the eutectic type, for example AuSn, are also known. In this case, soldering methods based on eutectics have the drawback of being carried out at high temperatures of the order of 300° C., which degrades the performance of the electronic functions performed by the components encapsulated by the housing. This is because, by thermoelastic effects, these high temperatures degrade the electronic components which are particularly sensitive to high temperatures and/or the junctions between these components and the housing. Moreover, if the junctions are produced by adhesive bonding, they will be degraded by degassing of the adhesives at these temperatures. Furthermore, when the method is controlled poorly, undesired intermetallic compounds are formed during the soldering, which weakens the solder joint for closing the housing.

Sealed housings obtained by adhesively bonding the support to the cover are also known. The adhesive bonding is easy to carry out, but they have the drawback of not ensuring good sealing of the housing because the organic materials contained in the adhesives are permeable to humidity in the more or less long term.

Sealed housings obtained by assembling the support and the cover by means of sealing glasses are also known. This type of method makes it possible to obtain housings which have good sealing. However, these sealing methods have the drawback of being carried out at high temperatures of the order of 350 to 400° C., which degrades the electronic components to be encapsulated or the junctions between the components and the support.

Housings are furthermore known which are assembled in a sealed manner by creating intermetallic compounds at the interface between the cover and the support. These housings have the advantage of requiring relatively low assembly temperatures (beyond 150° C.) and, once formed, of withstanding higher temperatures (of the order of 200° C.). Assembling a housing on the basis of creating intermetallics, however, has the drawback of requiring complicated means and long fabrication times (several hours). Furthermore, the intermetallics only make it possible to assemble metal housings which have high purity and are compatible with the intermetallics.

SUMMARY

It is an object of the present invention to provide sealed electronic housings which are economical, have good sealing, are mechanically strong and encapsulate high-performance electronic functions.

It is another object of the invention to provide a method for the sealed assembly of an electronic housing, which is easy to carry out and does not degrade the electronic performance of the electronic functions contained in the housing.

The invention thus relates to a sealed electronic housing comprising a support and a cover which are joined in a sealed manner so as to delimit a cavity containing at least one electronic component fixed to said support, said support and said cover being joined in a sealed manner by means of a joint comprising agglomerates of metal nanoparticles.

The electronic housing according to the invention optionally comprises the following characteristics, taken individually or in combination:
- the metal nanoparticles are nanoparticles of silver or alternatively copper, gold, another metal or a metal alloy,
- the support has a flat overall shape,
- the support comprises a base and an electrically insulating peripheral edge,
- the cover has the shape of a box,
- the support has the shape of a box,
- the cover has a flat overall shape.

The invention also relates to a method for the sealed assembly of an electronic housing containing one or more electronic components, comprising the following steps:
- a step of assembling the housing by bringing a support, to which the electronic component(s) is (are) fixed, in contact with a cover by means of a mixture comprising a paste and nanoparticles of size ranging from 10 to 30 nm in suspension in said paste,
- a step of closing the housing in a sealed manner by heating the housing to a temperature T of between 150 and 180° C. making it possible to sinter the metal nanoparticles and applying a pressure at least equal to $2.5 \times 10^5$ Pa.

The method according to the invention optionally comprises the following characteristics, taken individually or in combination:
- the temperature T is applied for a time D of greater than or equal to 10 minutes and preferably ranging from 10 to 30 minutes,
- the temperature T is applied pointwise to the junction between the cover and the support by means of a heat source which is moved along the junction,
- the heat source is a laser source,
- the paste comprises at least one organic solvent, the mixture comprises a concentration of nanoparticles by volume ranging from 70% to 90%, prior to the step of assembling the housing, it comprises a step of fixing the electronic component(s) on the support.

A second embodiment of the method according to the invention is such that the step of assembling the housing comprises a step of depositing a paste on the support and a step of bringing the support in contact with the cover by means of the paste.

Furthermore, the step of closing the housing in a sealed manner, by heating the housing to a temperature T of between 150° C. and 180° C. making it possible to sinter the metal nanoparticles, while subjecting the housing to a pressure at least equal to $2.5 \times 10^5$ Pa, comprises:

a first step of applying a laser source vertically onto said paste deposited on the support, prior to the step of bringing the support in contact with the cover, so as to remove solvent possibly contained in the paste and to initiate the sintering, a second step of applying the laser horizontally onto said paste subsequent to the step of bringing the support in contact with the cover by means of the paste.

The invention has the advantage of providing an electronic housing having good mechanical strength, encapsulating high-performance electronic functions. Furthermore, the housing according to the invention is obtained by means of a method which does not risk degrading the electronic functions performed by the components contained in the housing. The closure of the housing is simple to carry out and does not require complicated equipment.

BRIEF DESCRIPTION OF THE DRAWINGS

Other characteristics and advantages of the invention will become apparent on reading the following detailed description, which is provided by way of nonlimiting example and with reference to the appended drawings, in which.

From one figure to another, the same elements are denoted by the same references.

DETAILED DESCRIPTION

Figure 1:
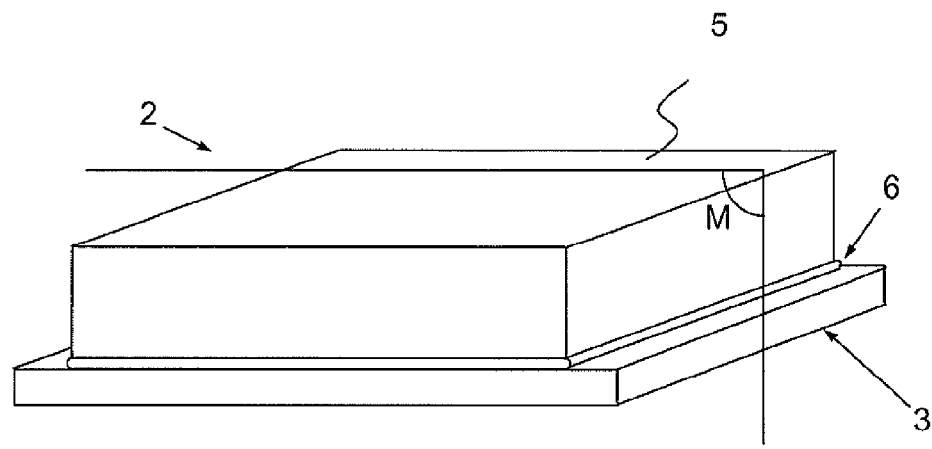
FIG. 1 schematically represents the exterior of a sealed electronic housing of a first example of a housing according to the invention in perspective, FIG. 2 schematically represents a section of the housing of FIG. 1, in an overall vertical plane M of the housing, FIG. 3 schematically represents a section in an overall vertical plane of a second example of a housing according to the invention, FIGS. 4a and 4b schematically represent a section in a first overall vertical plane, and respectively in a second overall vertical plane perpendicular to the first vertical plane, of a third example of a housing according to the invention, FIGS. 5a, 5b, 5c schematically represent the steps of the method according to the invention.
Figure 2:
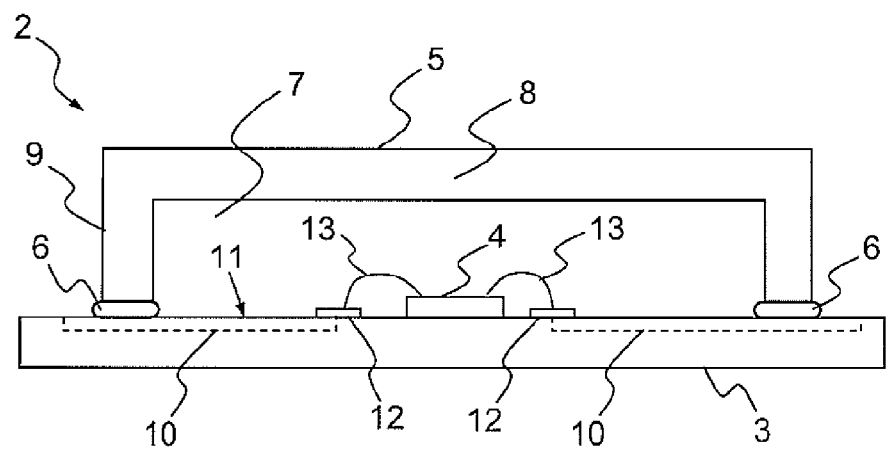

FIG. 1 represents in perspective the exterior of an overall parallelepipedal sealed electronic housing 2 of a first example of a housing according to the invention. The sealed electronic housing 2 comprises a support 3 and a cover 5, which are arranged so as to form a wall delimiting a cavity 7 containing an electronic component 4 (these are represented in FIG. 2) fixed to said support 3. The support 3 and the cover 5 are joined in a sealed manner by means of a joint 6 comprising an agglomerate of metal nanoparticles. The structure of the agglomerates is of the mesoscopic type.

FIG. 2 schematically represents a section of the housing represented in FIG. 1, in a vertical plane M. The electronic housing 2 comprises a cover 5 and a support 3, to which an electronic component 4 is fixed. In the embodiment represented in FIG. 2, the support 3 forms a base having the shape of an overall flat plate. The support 3 furthermore has a substrate function, the electronic component 4 being fixed (that is to say placed, attached, integrated) on the upper face 11 of the support 3. The housing is referred to as having an intelligent base.

The support 3 is advantageously made of ceramic. In the embodiment of FIG. 2, the support 3 is for example a multilayer ceramic substrate incorporating conductive vias 10 (these are represented by the dashed lines) produced in the substrate providing the electrical interconnection between the electronic component 4 and the exterior of the cavity 7. The electronic component is electrically connected to the conductors 10 by electrical connection means 13 connected to conductive pads 12, which are in turn connected to the conductive vias 10.

The cover 5 has the shape of a box. The box is inverted so that its opening faces the support 3. More precisely, the box is inverted onto the upper face 11 of the support 3. It comprises a base 8 and a peripheral border 9. The peripheral border 9 of the box is placed on the support 3, and more precisely on its upper surface 11 (which is the surface of the support facing the box), by means of a sealed joint 6 which joins the cover 5 to the support 3 in a sealed manner. The box surrounds the electronic component 4 at a distance. In other words, the cavity is delimited in its lower part by the base 3, in its upper part by the base 8 of the cover 5 and in its lateral part by the peripheral edge 9 extending from the base 8 to the cover 5.

The sealed joint 6 ensures mechanical and sealed connection between the support 3 and the cover 5. The joint 6, comprising agglomerates of metal nanoparticles, is advantageously obtained by sintering metal nanoparticles, as will be described below.

Figure 3:
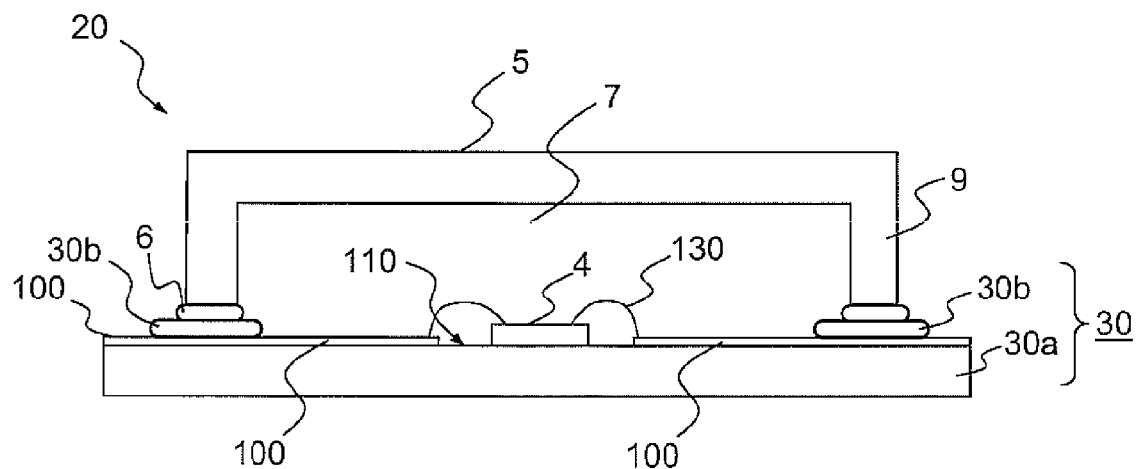

FIG. 3 schematically represents a section in a vertical plane of a second example of an electronic housing according to the invention, having overall the same shape as a housing represented in FIG. 1. In this embodiment, the support 30 comprises a base 30a and an electrically insulating peripheral edge 30b. The insulating edge 30b of the support is fixed to the base 30a in a sealed manner, more particularly to the upper face 110 of the base 30a (which is the surface of the base facing the cover). More precisely, the insulating edge is fixed directly to the base over certain portions, and by means of conductive tracks 100 which are interposed between the base and the edge over the other portions. The insulating edge is made of electrically insulating material, for example so-called low-temperature glass. The role of the substrate is performed by the base 30a, to which the electronic component 4 is fixed. The substrate 30a is not a multilayer substrate in this embodiment. It is, for example, a substrate made of ceramic or other inorganic material such as quartz, sapphire and the like. The interconnections between the electronic component 4 and the exterior are formed on the surface of the base 30a by means of conductive tracks 100 extending over the upper surface 110 of the base 30a and reaching the exterior of the cavity by passing under the insulating material 30b. The electronic component 4 is connected to the conductive tracks 100 by electrical connection means 130.

In this embodiment, the peripheral border 9 of the box is placed on the support 30, more precisely on the insulating edge 30b of the support, by means of a sealed joint 6 connecting the cover 5 to the support 30 in a sealed manner. Advantageously, in a horizontal plane i.e. a plane parallel to the base 30a, the insulating edge 30b has a shape overall identical to that of the peripheral border, for example overall rectangular or circular. The widths of the two edges, in the horizontal plane, are not necessarily identical. Thus, the box is placed on the edge 30b over its entire periphery. In other words, the cavity is delimited in its lower part by the base 30a, in its upper part by the base 8 of the cover 5 and in its lateral part by the peripheral border 9 and the insulating edge 30b.

Figure 4A:
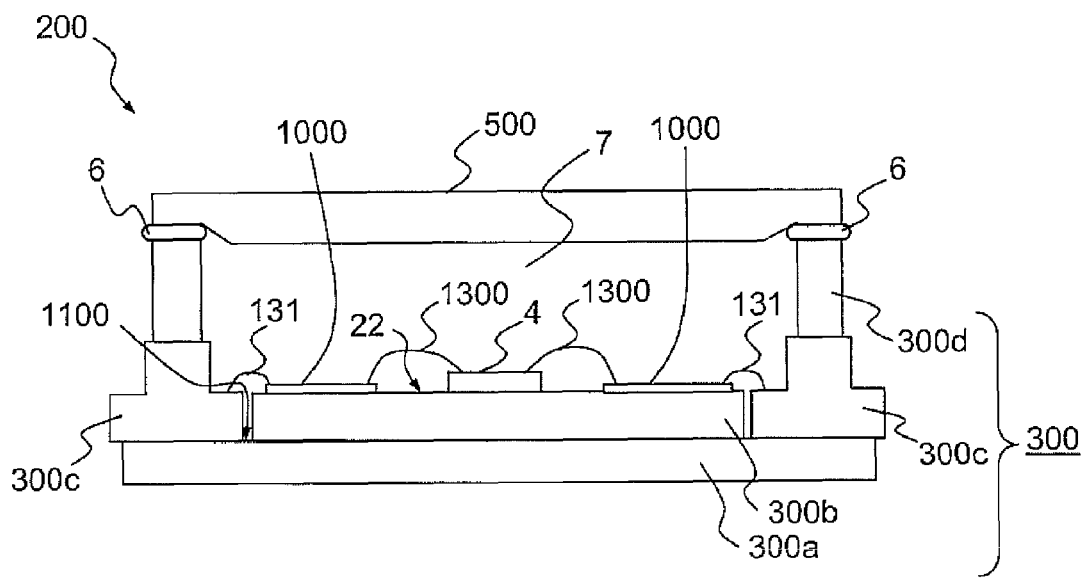
Figure 4B:
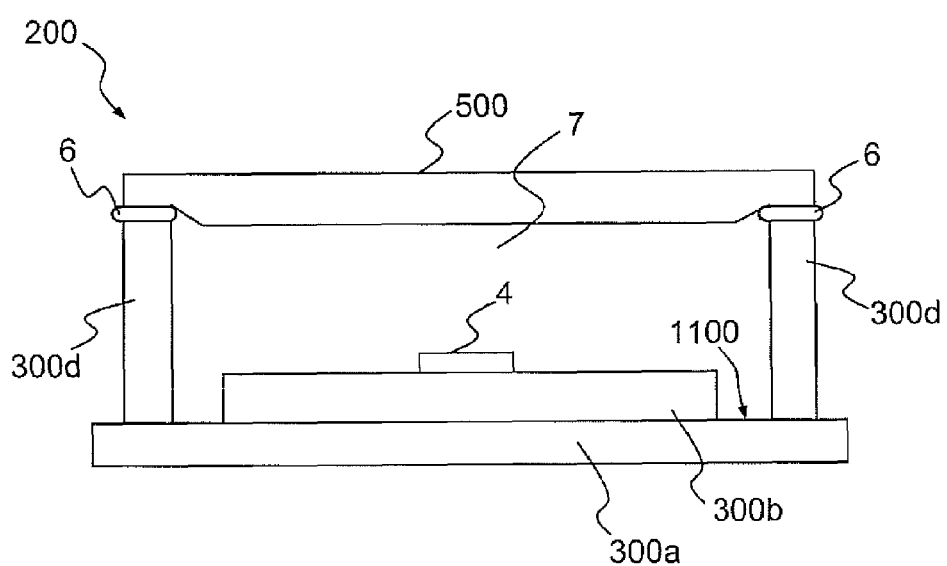

FIGS. 4a and 4b schematically represent a section in a first overall vertical plane, and respectively in a second overall vertical plane perpendicular to the first vertical plane, of a housing 200 according to a third embodiment of the invention. The support 300 has the shape of a box. It comprises a base 300a and a substrate 300b, fixed on the upper surface 1100 of the base 300a. In this embodiment, the base 300a is for example made of metallic material, most often ferronickel-cobalt, copper-tungsten or of highly thermally conductive material. The substrate 300b is for example made of ceramic and, more generally, dielectric material.

The electronic component 4 is fixed on the upper face 22 (that is to say the one facing toward the support) of the substrate 300b. The interconnection between the interior and the exterior of the cavity is formed by means of ceramic inserts (or penetrations) 300c fixed to the base 300a in a sealed manner, for example by soldering. The electronic component 4 is connected to the ceramic inserts 300c by means of first electrical connections 1300 connecting the component 4 to tracks 1000 formed on the upper surface of the conductive substrate 300b, and second electrical connections 131 connecting the tracks 100 to the inserts 300c. The support 300 furthermore comprises a frame 300d fixed to the inserts 300c and the base 300b in a sealed manner. The frame is conductive. It is, for example, made of metal.

The metal frame 300d forms a border at the periphery of the base 300a. The junctions between the frame 300d, and the inserts 300c on the one hand and the base 300a on the other hand, are formed for example by soldering. In this embodiment, the cover 500 has the shape of a plate, for example overall rectangular. It is attached to the metal frame 300d and joined to the support 300, more particularly to the frame 300d, by means of a joint 6 producing sealed connection between the support 300 and the cover 500. The peripheral frame 300d extends between the cover 500 and alternatively the base 300a and the inserts 300c. The cavity 7 is delimited in its lower part by the substrate 300b and the base 300a facing it, in its upper part by the cover and in its lateral part by the frame 300d and the inserts 300c.

An electronic housing comprising a single electronic component has been represented in the figures above, although it may of course comprise a plurality of electronic components 4. The electronic components 4, fixed to the support 3, 30, 300 and accommodated inside the cavity, may be of different types, for example passive components, active components or microsystems. The invention is particularly advantageous for components susceptible to being degraded at high temperature, that is to say at a temperature above 200° C. This is the case with microelectromechanical systems MEMS.

A housing according to the invention has a size of between 1 mm$^3$ and several cm$^3$. The proposed invention is particularly advantageous in the case of housings which delimit very small cavities (housings with a small size of the order of one mm$^3$) because these are not compatible with wheel closure methods.

Shear tests generally make it possible to characterize a joint. For a housing which has a joint 6 comprising agglomerates of metal nanoparticles, the Applicant has observed that the shearing of the interface takes place in the joint itself, which ensures good adhesion between the joint and the surfaces of the support and of the cover to be assembled.

Figure 5A:
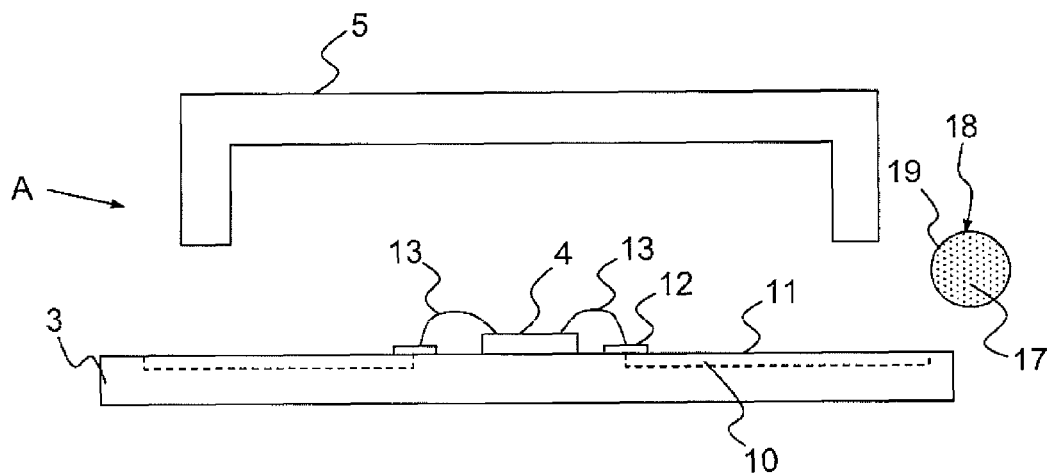
Figure 5B:
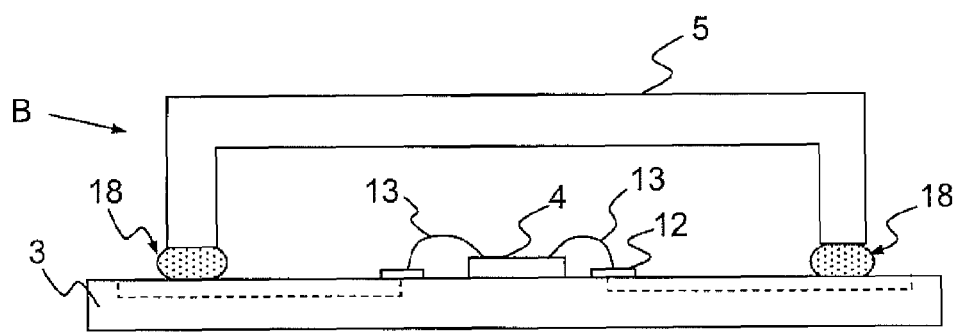
Figure 5C:
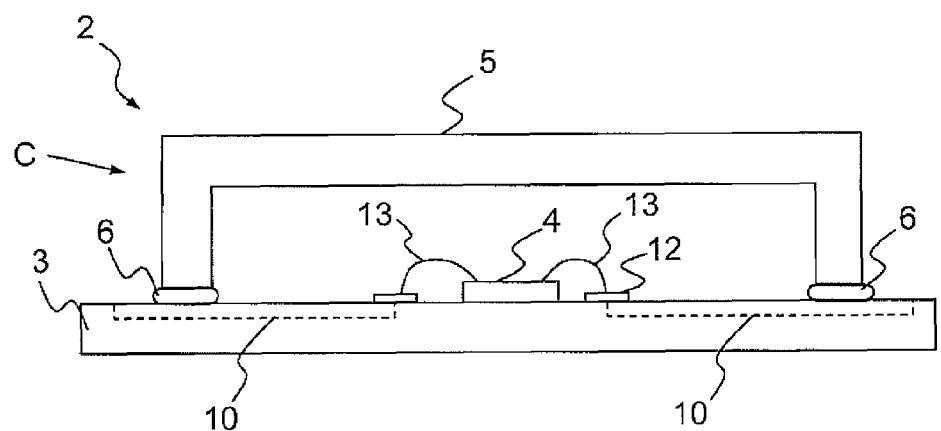

The steps of the method for the sealed assembly of the electronic housing 2 according to the invention will now be described, as represented in FIGS. 5a, 5b, 5c which schematically represent an example of respective steps of a method for the sealed assembly of an electronic housing 2 according to the first embodiment. In the method according to the invention a cover 5 and a support 3, to which at least one component 4 is fixed, are first provided A. The connections between the interior and the exterior of the housing are also produced.

The method comprises the following steps:
  a step B of assembling the housing 2 by bringing the support 3, to which the electronic component(s) 4 is (are) fixed, in contact with the cover 5 by means of a mixture 18 comprising a paste 19 and nanoparticles 17 in suspension in said paste 19,
  a step C of closing the housing in a sealed manner by heating the housing 2 to a temperature T making it possible to sinter the metal nanoparticles.

The mixture is advantageously applied to the interface between the support and the cover. The assembly step advantageously comprises a step (not represented) of applying the mixture 18 onto the support 3 and/or onto the cover 5, at the interface between said cover 5 and said support 3.

In the device according to the first embodiment, the interface between the cover 5 and the support 3 comprises the lower border of the cover 5 (that is to say the part of the peripheral border 9 facing the support) and a part of the periphery of the lower surface 11 of the base 3a, having the same shape as the lower border of the cover 5. The method according to the invention is also used for assembling the housings represented in FIGS. 3, 4a and 4b. The interface between the cover and the support of the housing represented in FIG. 3 comprises the lower border of the cover 5 as well as the upper border of the insulating edge 30b (that is to say the border of the insulating edge which faces the cover 5). The interface between the cover and the support of the housing represented in FIGS. 4a and 4b comprises the upper border of the frame 300d (that is to say the border of the frame facing the cover) as well as a part of the periphery of the cover 500, having the same shape as the upper border of the frame 300d.

The paste 19 advantageously comprises one or more organic solvents. The organic solvent is for example terpineol, alpha-terpineol, toluene, hexane or xylene. The organic solvent is used to transport the nanoparticles and to prevent agglomeration of these nanoparticles 17. These organic compounds may be binders and/or dispersants. The mixture 18 preferably comprises a concentration of metal nanoparticles 17 ranging from 70% to 90% by volume, and a concentration of solvent ranging from 10 to 30% by volume. These concentrations make it possible to obtain the sintering.

Advantageously, the evaporation temperature of the solvents is lower than the temperature T.

The term nanoparticle is intended to mean a particle whose size ranges from 10 to 100 nm. The size of the nanoparticles preferably ranges from 10 nm to 30 nm. The term size is intended to mean the diameter of the nanoparticles. It is the nanometric size of the particles which makes it possible to carry out the sintering at low temperature. The smaller the particles are, the lower the sintering temperature is, but with a lower limit because when the nanoparticles are too small the joint obtained may be electrically conductive. With nanoparticles of size greater than 30 nm, the Applicant has observed that it is impossible to carry out the sintering at a temperature lower than 200° C. at the pressures used, for example at 2.5 bar. This is because the sintering temperature of the particles rises when the size of the nanoparticles increases.

The paste is advantageously prepared by a method comprising a step of producing the nanoparticles from a stabilized colloidal solution or by decomposition of a precursor or by another method, a step of preparing and recovering the powder of nanoparticles and a step of dispersing the nanoparticles in the solvent (for example by an ultrasonic method which allows homogeneous dispersion without causing sintering of the nanoparticles).

The metal nanoparticles are preferably particles of silver Ag. Silver is particularly advantageous because it is compatible (no electrolytic phenomenon) with various materials which may be contained in the cover and in the parts of the support in contact with the cover, namely tin Sn, gold Au and/or nickel Ni. Silver has physical characteristics (crystalline structure, atomic radius, electronegativity, etc.) and chemical characteristics (low oxidizability etc.) extremely similar to gold. According to the Hume-Rothery rules, which make it possible to predict the formation of stable solid solutions in wide ranges of compositions, when the cover and the support comprise gold at their interface, the gold and the silver form an alloy with complete solubility (confirmed by their equilibrium diagram) which is therefore not fragile because it is stable in any composition (no creation of intermetallics between the gold and the silver). Good mechanical strength of the housing is thus ensured. The metal nanoparticles may also be nanoparticles of copper, gold or another metal or of a metal alloy. When the housing 2 is heated to the temperature T, the nanoparticles 17 contained in the mixture agglomerate. This is referred to as densification by sintering. They also form mechanical bonds with the support 3, on the one hand, and the cover 5 on the other hand, so that the agglomerates of nanoparticles 17 form a mechanical connection between the cover and the support. The mechanical bonds between the nanoparticles and the support 3 and/or the cover may be of chemical or purely mechanical origin (for example by penetration of metal nanoparticles into holes formed on the surface of the cover and the support). When the surface of the support 3 and/or respectively of the cover 5, lying at the interface with the mixture 18, comprises gold (the case of a metal support and/or cover comprising some gold), silver nanoparticles contained in the joint advantageously form a gold-silver alloy with the gold lying at the interface between one part and the joint, which mechanically bonds the part in question and the joint (bond of chemical origin).

After the sintering temperature has been applied, at least some of the solvents are evaporated and the joint 6 lying at the junction between the support and the cover comprises agglomerated nanoparticles and pores, as well as possibly chemical bonds established between the metal constituting the nanoparticles and the components of the support. More particularly, the joint comprises a concentration of agglomerated nanoparticles ranging from 65% to 80% by volume, and a large part of the remaining 20% to 35% comprises pores.

The Applicant has demonstrated that the joint 6 forms a sealed connection between the support and the cover. Specifically, the Applicant carried out a fine leak test on an electronic housing according to the first embodiment in a chamber pressurized with helium. They measured a helium leakage rate of the order of $10^{-7}$ atm·cm$^3$/s. It is in fact considered that a housing conventionally has good sealing when the helium leakage rate lies between $10^{-7}$ and $10^{-8}$ atm·cm$^3$/s, depending on the volume of the sealed cavity, 1 atm·cm$^3$ being equal to 1 mbar. The porous joint 6 thus forms a sealed connection between the support and the cover. The densification takes place when the solvents evaporate. The densification first occurs at the periphery of the joint, where the solvent can escape more easily. This peripheral densification may then block the path for evaporation of the solvent inside the joint. Solvent may remain at the center of the joint, limiting the densification there. Thus, the joint 6 comprises agglomerates of metal nanoparticles 17 at least in its periphery.

The temperature T for sintering the nanoparticles of the mixture ranges from 150 to 250° C., so as not to degrade the electronic components fixed to the support 3. The fundamental advantage associated with this low sintering temperature is the absence of degradation of the functions performed by the electronic components during formation of the sealed joint. Furthermore, the method is simple to carry out. The assembled sealed housing is moreover capable of withstanding much higher temperatures after sintering: about 800° C. for sintering of silver nanoparticles at 180° C. The temperature T preferably ranges from 150° C. to 180° C. These temperatures ensure that components of the MEMS type are not degraded. The smaller the nanoparticles are, the more the selection of a low temperature T is possible.

When the housing 2 assembled by means of the mixture 18 is heated to the sintering temperature T, a compressive force is preferably exerted on the housing, which holds the support and the cover against one another. The pressure exerted is preferably of the order of 0 to 300 gram-force (gravet), where 1 gravet is equal to 9.80665 mN.

When the applied compressive force is higher, the joint will be commensurately denser, that is to say solid and sealed. The application of a high pressure on the housing furthermore makes it possible to shorten the application time D of the sintering temperature and/or to lower the temperature T.

Furthermore, during application of the sintering temperature, the housing is advantageously placed under a pressure at least equal to 2.5 bar, that is to say $2.5 \times 10^5$ pascals. For example, the pressure is equal to 2 bar.

Below 2.5 bar, the Applicant has observed that it is not possible to obtain either the fusion or the densification necessary for obtaining a sealed joint.

The Applicant has more particularly observed that it is possible to obtain a sealed joint at temperatures ranging from 150 to 180° C., making it possible to ensure the absence of degradation of the electronic components, only at a pressure at least equal to 2.5 bar and by using nanoparticles having a size ranging from 10 to 30 nm. Outside these intervals, the use of a higher temperature is necessary.

Advantageously, the temperature is applied pointwise to the junction between the cover and the support by means of a heat source which is moved along the junction, for example a laser source.

Advantageously, the housing is heated to the temperature T for a predetermined time D so as to allow sintering of the metal nanoparticles 7 and maximal evaporation of the solvents of the paste 19. Preferably, the application time D of the temperature T is greater than or equal to 10 minutes, and preferably ranges from 10 to 30 minutes. The smaller the size of the nanoparticles is, the more it is possible to select a low temperature T and/or a short time D.

Advantageously, the pressure, the sintering temperature T and the application time D of the temperature T are adapted as a function of the strength of the electronic components, the strength of the bonds between the components and the substrate, as a function of the desired mechanical strength and sealing of the housing, and as a function of the size of the nanoparticles.

Advantageously, prior to the step of applying a paste 18, the method according to the invention comprises a step of fixing the electronic component(s) 4 to said support and possibly a step of establishing electrical connections in the housing.

In the embodiments represented in FIGS. 3, 4a and 4b, prior to the step of assembling the housing, the assembly method according to the invention advantageously comprises a step of assembling the support, that is to say a step of assembling the parts constituting the support 30, 300. Advantageously, the step of fixing the component(s) to the support is carried out after this step so that the step of assembling the support does not degrade the functions performed by the components.

The method according to the invention makes it possible to obtain a joint different to a solder or an amalgam. The aggregation (sintering) is similar to local soldering at the joints, but without refusion of the metal nanoparticles. Sintering is a method of densification by diffusion in the solid state without refusion.

A second embodiment of the method according to the invention is such that the step of assembling the housing comprises a step of depositing a paste on the support, and a step of bringing the support in contact with the cover by means of the paste.

Furthermore, the step of closing the housing in a sealed manner by heating the housing to a temperature T of between 150° C. and 180° C. making it possible to sinter the metal nanoparticles, while subjecting the housing to a pressure at least equal to $2.5 \times 10^5$ Pa, comprises:
- a first step of applying a laser source vertically onto said paste deposited on the support, prior to the step of bringing the support in contact with the cover, so as to remove solvent possibly contained in the paste and initiate the sintering,
- a second step of applying the laser horizontally onto said paste, after the step of bringing the support in contact with the cover by means of the paste.

The invention claimed is:

1. A method for the sealed assembly of an electronic housing containing one or more electronic components, said method comprising:
   assembling the housing by bringing a support, to which the electronic components are fixed, in contact with a cover by a mixture of a paste and nanoparticles in suspension in said paste, the size of the nanoparticles ranging from 10 to 30 nm; and
   closing the housing in a sealed manner by heating the housing to a temperature T of between 150° C. and 180° C. for sintering the metal nanoparticles, while subjecting the housing to a pressure at least equal to $2.5 \times 10^5$ Pa.

2. The method for the sealed assembly of an electronic housing as claimed in claim 1, wherein the temperature T is applied for a time D of greater than or equal to 10 minutes.

3. The method for the sealed assembly of an electronic housing as claimed in claim 2, wherein the time D is in the range from 10 to 30 minutes.

4. The method for the sealed assembly of an electronic housing as claimed in claim 1, wherein the heating of the housing is performed by applying a laser source.

5. The method for the sealed assembly of an electronic housing as claimed in claim 4,
   wherein assembling the housing comprises depositing a paste on the support and bringing the support in contact with the cover by means of the paste; and
   wherein closing the housing in a sealed manner, by heating the housing to a temperature T of between 150° C. and 180° C. for sintering the metal nanoparticles, while subjecting the housing to a pressure at least equal to $2.5 \times 10^5$ Pa, comprises:
      applying the laser source vertically onto said paste deposited on the support, prior to the bringing the support in contact with the cover, so as to remove any solvent contained in the paste and to initiate the sintering; and
      applying the laser source horizontally onto said paste subsequent to the bringing the support in contact with the cover by means of the paste.

6. The method for the sealed assembly of an electronic housing as claimed in claim 1, wherein the paste comprises at least one organic solvent.

7. The method for the sealed assembly of an electronic housing as claimed in claim 1, wherein the mixture comprises a concentration of nanoparticles by volume ranging from 70% to 90%.

8. The method for the sealed assembly of an electronic housing as claimed in claim 1, further comprising fixing the electronic components on the support prior to assembling the housing.

9. The method for the sealed assembly of an electronic housing as claimed in claim 1, wherein the temperature T is applied pointwise to the junction between the cover and the support by means of a heat source which is moved along the junction.

* * * * *